United States Patent [19]

Armstrong, II

[11] Patent Number: 5,418,487
[45] Date of Patent: May 23, 1995

[54] FUSE STATE SENSE CIRCUIT

[75] Inventor: Gene L. Armstrong, II, Garland, Tex.

[73] Assignee: Benchmarg Microelectronics, Inc., Carrollton, Tex.

[21] Appl. No.: 940,612

[22] Filed: Sep. 4, 1992

[51] Int. Cl.$^6$ .......................................... H01H 37/76
[52] U.S. Cl. .................................... 327/525; 326/38
[58] Field of Search .................. 307/202.1, 465, 468; 365/96, 225.7

[56] References Cited

U.S. PATENT DOCUMENTS

| | | | |
|---|---|---|---|
| 4,446,534 | 5/1984 | Smith | 307/202.1 |
| 4,608,530 | 8/1986 | Bacrania | 307/202.1 |
| 4,686,384 | 8/1987 | Harvey et al. | 365/96 |
| 4,730,129 | 3/1988 | Kunitoki et al. | 307/202.1 |
| 5,173,616 | 12/1992 | Hinooka | 307/202.1 |

*Primary Examiner*—Edward P. Westin
*Assistant Examiner*—Jon Santamauro
*Attorney, Agent, or Firm*—Gregory M. Howison

[57] ABSTRACT

A fuse state sense circuit includes a fusible link (40) that is disposed between a node (38) and ground. A programming/sense pad (42) is provided to allow voltage to be applied to the node (38) external to the fuse state sense circuit. Current is provided to the node (38) through a current source (30) and a transistor (36). The transistor (36) is controlled by a bias current. An output node (32) is disposed between the current source (30) and the transistor (36). This is connected to the output through an inverter (34). In operation, the voltage on node (38) is raised to a first level to turn off transistor (36) to allow the output to be exercised and to change the state thereof to emulate the fusible link (40) being open. In a second and programming mode, the voltage on the node (38) is raised to a much higher level to allow sufficient current to flow through fusible link (40) to open it. Transistor (36) in this mode is rendered non-conductive and isolates the node (38) from the remaining portion of the circuit.

5 Claims, 1 Drawing Sheet

FUSE STATE SENSE CIRCUIT

TECHNICAL FIELD OF THE INVENTION

The present invention pertains in general to a programmable fuse on an integrated circuit, and more particularly, to a circuit for isolating the programming operation of the fuse from the remaining portion of the circuit and also for sensing the logic state of the fuse through the programming pin of the fuse circuit.

BACKGROUND OF THE INVENTION

Fuse circuits are typically utilized to permanently set a logic state through the use of a programmable fuse link. Fusible links are typically incorporated in a conductive path of a logic circuit such that when the fuse is intact, current flows therethrough to present one logic state on the output of the fuse circuit. When the fuse is broken or open, a resulting high impedance causes an interruption of current, thus forcing the output circuit associated with the fuse to a different logic state.

Typically, the fuse is a thin strip of conductive material that can be severed or broken by passing an excessive amount of current therethrough. This is achieved by attaching a programming pad to one side of the fuse, the other side being connected to reference voltage such as ground or $V_{SS}$. The voltage on the pad is then raised to a predetermined programming voltage, above which excessive current passes through the fuse and causes it to "burn out" and therefore provide an open circuit.

One disadvantage to programming fuses in the conventional way is that if the voltage reaches a level that is higher than the power supply, a current path can be created from the programming pad back through active circuitry to the power supply and thus pump current through the power supply. This can result in damage to other active components. It is therefore desirable to have some type of isolation. Another disadvantage to present fuse circuits is that the only way to determine the state of the fuse is to actually program the fuse by opening it and then observing the output. Some systems have actually incorporated gate logic to allow a logic signal to be ORed with the output of the fuse circuit to determine the effect that the fuse will have on the circuit. For example, in some circuits, it is desirable to determine what effect a certain program word will have. This can be achieved by forcing the output of the fuse circuits to a predetermined logic state and then observing the effect of this output state on the rest of the circuitry. However, this requires additional logic, and if the fuse is faulty, an error may result.

SUMMARY OF THE INVENTION

The present invention disclosed and claimed herein comprises a fuse state sense circuit. The fuse state sense circuit includes a fusible link connected between a first node and a second node and having a first intact state and a second open state. The second node is connected to a low reference voltage such as ground. A programming/sense terminal is provided for interfacing between the first node and an external voltage source. An output node is provided for outputting the first and second logic circuits indicative of the state of the fusible link. A current source is provided for driving current through the output node to the fuse node from a high reference voltage when the fusible link is in the first intact state. This results in a low voltage being disposed on the first node and the output node. The low voltage on the output node corresponds to the first logic state thereon. When the fusible link is in the second open state, current is substantially interrupted through the fusible link and the output node is pulled to the high reference voltage level, corresponding to the second logic state on the output node. The fusible link is operable to be placed in the second open state by the application of a programming voltage on the programming/sense terminal. Additionally, a sense control circuit is provided for driving the output node to a high voltage level when a voltage is disposed on the programming/sense terminal that is greater than a predetermined threshold and less than the programming voltage and while the fusible link is in the first intact state.

In another aspect of the present invention, the first node and the fusible link are isolated from the high reference voltage and the output node during the programming operation. An N-channel transistor is disposed between the output node and the first node connected to the fusible link, which transistor is conductive during normal operation. The gate of the transistor is biased such that it is substantially conductive when the fusible link is in the first intact state. When the voltage on the programming/sense terminal is disposed at the programming voltage, the transistor is rendered substantially non-conductive.

In a further aspect of the present invention, the N-channel transistor is biased such that when the voltage on the first node is disposed at the sense voltage, the N-channel transistor is rendered non-conductive.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
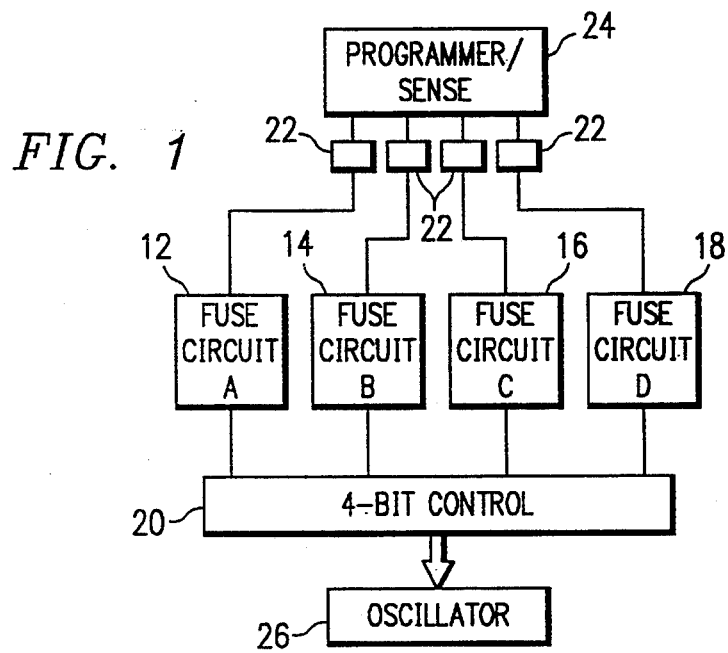
FIG. 1 illustrates a block diagram of an application of the fuse state sense circuit utilized with the present invention.

Referring now to FIG. 1, there is illustrated a block diagram of an application for the fuse state sense circuit of the present invention. Four fuse state sense circuits, 12, 14, 16 and 18, are illustrated, each having an output for providing a single logic bit, which logic bit is either at a logic "0" state or at a logic "1" state. Four fuse state sense circuits are provided to output a 4-bit word, which is input to a 4-bit control circuit 20. Each of the fuse state sense circuits 12 has a programming pad 22 associated therewith, which is operable to be attached to a programmer/sense control circuit 24. The programmer/sense control circuit 24 is operable to place a programming voltage on the pad 22 in a programming mode to program the fuse by opening it. When the voltage rises above a predetermined level, sufficient current is passed through an internal fuse within the fuse state sense circuits 12–18 to open the fuse. However, in a sense mode, the programmer/sense control circuit 24 is operable to place a sense voltage on the respective pad 22 for each of the fuse state sense circuits 12-18 to change the output state thereof. Therefore, both programming and sensing are effected through the pad 22, as will be described in more detail hereinbelow.

The output of the 4-bit control circuit 20 is input to an oscillator, in one example. By manipulating the voltage on the pads 22 prior to programming thereof, the output states can be adjusted without actually programming the fuse to determine what effect the 4-bit word in the 4-bit control circuit 20 has on the oscillator 26. If the desired effect is achievable, then the programming/sense control circuit 24 is operated to program those states into the fuse sense circuits 12-18.

Figure 2:
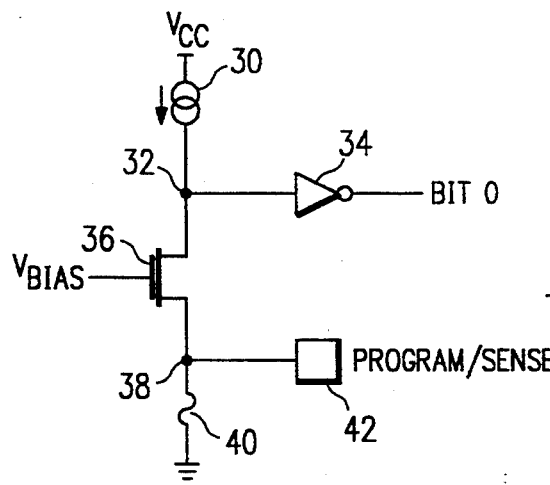
FIG. 2 illustrates a simplified schematic diagram of the fuse state sense circuit of the present invention.

Referring now to FIG. 2, there is illustrated a simplified schematic diagram of the fuse state sense circuits 12-18. Each of the fuse state sense circuits 12-18 is operable to output a single bit, the bit illustrated in FIG. 2 being BIT0. A current source 30 is provided that is connected between the supply voltage $V_{CC}$ and a node 32. The node 32 comprises the output node and is connected to the input of an inverter 34, the output of which provides the output BIT0. Node 32 is also connected to one side of the source/drain path of an N-channel transistor 36, the other side of which is connected to a node 38. The node 38 is connected to one side of a fusible link 40, the other side of which is connected to ground or $V_{SS}$. The node 38 is also connected to a program/sense pad 42, which pad 42 is operable to be interfaced external to the fuse state circuit. The gate of the transistor 36 is connected to a bias voltage $V_{BIAS}$.

In operation, the fusible link 40 is normally intact and provides a conductive path from node 38 to ground. This therefore pulls the drain of the transistor 36 to ground. The bias voltage is such that when current is supplied to node 32 by a current source 30, node 32 is pulled to ground through the source/drain path of the transistors. Therefore, the voltage $V_{BIAS}$ must be such that transistor 36 is in the linear mode of operation when the fusible link 40 is intact.

The fuse state sense circuit operates in a normal mode to pull the node 32 to ground when the fusible link 40 is intact, and, when the fusible link 40 is opened, the node 32 is pulled high to $V_{CC}$, such that the logic state of the output BIT0 is changed. Therefore, the fusible link 40 allows selection of the logic state of the output. The pad 42 is operable to provide two modes of operation, a programming mode and a sense mode. In the programming mode, the voltage on the node 38 is raised to a level that reduces the voltage difference between $V_{BIAS}$ and node 38 to a level that is substantially equal to or less than the $V_T$ of transistor 36. It is noted that the bias signal $V_{BIAS}$ pulls the signal up to a level that is substantially greater than $V_{BIAS} - V_T$. When the voltage at node 38 exceeds this voltage, the transistor 36 is rendered nonconductive. This essentially simulates the condition wherein the fusible link 40 is opened. This will result in the node 32 being pulled high by the current source 30 and the logic state of the output BIT0 changing. Therefore, a relatively small voltage can be placed on the fusible link 40 that is insufficient to create a current flow therethrough of sufficient magnitude to open the fusible link 40. This allows an operator to actually exercise the logic state of the fuse state sense circuit without requiring additional logic, and requiring only a single pad for both the program and the sense operation.

In the second mode, the programming mode, the voltage on the pad 42 is raised to a sufficiently high voltage to create a current through the fusible link 40 of sufficient magnitude to cause the fusible link 40 to heat up and open. This is conventional and is used widely in the industry as a technique for "blowing" a fuse or "programming" a fuse. However, one disadvantage to prior systems is that the voltage is raised to such a level that it may even exceed the supply voltage level. If this happens, active elements in the circuit could conduct current back to the supply voltage, which is a disadvantageous effect. In the system of the present invention, the transistor 36 is turned off whenever the voltage on the node 38 rises above one $V_T$ above ground. Therefore, during the programming of the fuse 40, the transistor 36 is turned off to substantially isolate the node 38 from the remainder of the circuit and specifically from the supply. This allows all the current from the path 42 to flow through the fusible link 40 for opening thereof.

Figure 3:
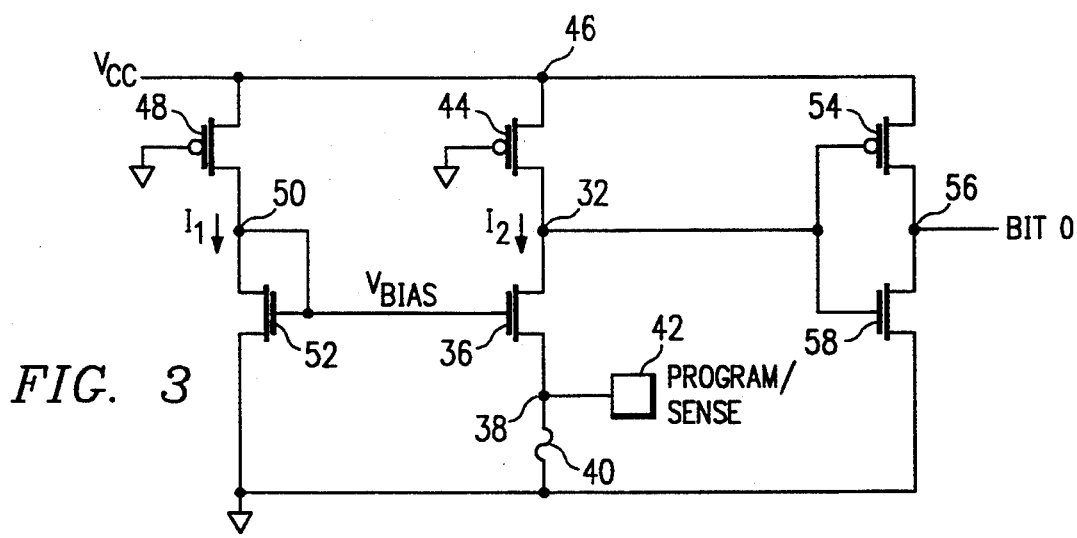
FIG. 3 illustrates a detailed circuit diagram of the fuse state sense circuit of the present invention.

Referring now to FIG. 3, there is illustrated a more detailed schematic diagram of the fuse state sense circuit. The current source 30 is realized with a P-Channel transistor 44 having one side of the source/drain path thereof connected to the supply voltage $V_{CC}$ at a node 46, and the other side of the source/drain path thereof connected to the node 32. The gate of the P-Channel transistor 44 is connected to a bias reference, in the preferred embodiment. Therefore, when the transistor 36 is conductive, the P-Channel transistor 44 is conductive and provides a relatively constant current.

In order to provide a bias to transistor 36 which renders transistor 36 capable of sinking a greater current than transistor 44 is capable of sourcing, multiplying current mirror is provided. The current $I_1$ is matched to the sourcing current capability of transistor 44 by virtue of the similar bias and sizing of transistor 48 to transistor 44. This current is mirrored as a multiple of $I_1$ in transistor 36 by the sizing ratio between transistor 52 and transistor 36. This is a conventional current mirror configuration, which attempts to force a substantially constant current through transistor 44 that is labelled $I_2$. Whenever the fusible link 40 is open, the drain of transistor 36 at node 38 will rise, since transistor 36 is nonconductive and the current $I_2$ will decrease.

The inverter 34 is realized with a P-Channel transistor 54 having the source/drain path thereof connected between the $V_{CC}$ node 46 and an output node 56, and the gate thereof connected to the node 32. An N-channel transistor 58 is provided having the source/drain path thereof connected between the node 56 and ground, and the gate thereof connected to the node 32. This is a conventional inverter configuration, that results in transistor 58 conducting when the node 32 is pulled high by transistor 44 with transistor 36 in a nonconductive mode, and results in transistor 54 conducting when node 32 is pulled low by transistor 36 in the conductive mode with the fusible link 40 being intact.

In summary, there has been provided a fuse state sense circuit that is operable to allow the internal fuse associated therewith to be programmed by a single output programming pad. Additionally, the single output programming pad also functions to allow a voltage to be applied thereto to exercise the fuse state sense circuit to determine the logic state output therefrom prior to programming the fuse state sense circuit. Further, isolation is provided during the programming of the fuse to prevent the programming voltage from being reflected back through the active elements in the fuse state sense circuit to the power supply terminal.

Although the preferred embodiment has been described in detail, it should be understood that various changes, substitutions and alterations can be made therein without departing from the spirit and scope of the invention as defined by the appended claims.

What is claimed is:

1. A method for programming and sensing the state of a fusible link having a first intact state and a second open state, comprising the steps of:
   providing a fuse node, the fusible link connected between the fuse node and a low reference voltage level;
   providing an output node having first and second logic states;
   driving current through the output node and the fusible link from a high reference voltage level when the fusible link is in the first intact state, the step of driving pulling the output node to the low reference voltage level corresponding to the first logic state on the output node;
   sensing the state of the fusible link by the step of applying a sense voltage from an external source to the fuse node, the sense voltage having a level above a predetermined threshold level but below a level that will cause damage to the fusible link, the step of applying the sense voltage substantially interrupting current through the output node such that the step of driving drives the output node to the high reference voltage level corresponding to the second logic state on the output node;
   monitoring the output node to determine the state of the fusible link; and
   removing the sense voltage from the fuse node without damaging the fuse after the step of monitoring.

2. The method of claim 1, wherein the step of driving comprises the steps of:
   connecting a current source between the high reference voltage and the fuse node through the output node; and
   conducting a substantially constant current through the current source to the fuse node through the output node when the fusible link is in the first intact state such that the output node is pulled to the low reference voltage level.

3. The method of claim 1, wherein the step of sensing comprises providing a sense transistor having a source/drain path and a gate and disposing the source/drain path of the sense transistor between the fuse node and the output node and biasing the gate to a voltage level sufficient to allow the sense transistor to conduct when the fusible link is in the first intact state and the step of applying the sense voltage to the fuse node substantially rendering the sense transistor substantially non-conductive.

4. The method of claim 1, and further comprising, programming the fusible link to the second open state from the first intact state by applying a programming voltage to the fuse node, the programming voltage being substantially above the predetermined sense threshold level voltage, wherein current is substantially interrupted to the fuse node and to the output node such that the output node is driven to the high reference voltage level corresponding to the second logic state on the output node.

5. The method of claim 4, wherein the step of programming further includes isolating the fuse node from the output node when the programming voltage is applied to the fuse node such that current is prevented from flowing from the fuse node to the output node and to the high reference voltage level.

* * * * *